(12) United States Patent
Murphy

(10) Patent No.: US 11,906,565 B2
(45) Date of Patent: Feb. 20, 2024

(54) RELATING TO TESTING

(71) Applicant: BAE Systems plc, London (GB)

(72) Inventor: Ben Anthony Murphy, Preston (GB)

(73) Assignee: BAE Systems plc, London (GB)

( * ) Notice: Subject to any disclaimer, the term of this patent is extended or adjusted under 35 U.S.C. 154(b) by 201 days.

(21) Appl. No.: 17/427,889

(22) PCT Filed: Feb. 28, 2020

(86) PCT No.: PCT/GB2020/050489
§ 371 (c)(1),
(2) Date: Aug. 2, 2021

(87) PCT Pub. No.: WO2020/178565
PCT Pub. Date: Sep. 10, 2020

(65) Prior Publication Data
US 2022/0120801 A1    Apr. 21, 2022

(30) Foreign Application Priority Data

Mar. 6, 2019 (EP) ................................... 19275027
Mar. 6, 2019 (GB) .................................. 1902990.9

(51) Int. Cl.
*G01R 31/00*  (2006.01)
*G01R 29/08*  (2006.01)
*G01R 31/327* (2006.01)

(52) U.S. Cl.
CPC ....... *G01R 31/008* (2013.01); *G01R 29/0821* (2013.01); *G01R 31/002* (2013.01); *G01R 31/327* (2013.01)

(58) Field of Classification Search
CPC ............. G01R 31/008; G01R 29/0821; G01R 31/002; G01R 31/327; G01R 31/001
See application file for complete search history.

(56) References Cited

U.S. PATENT DOCUMENTS

| 5,510,658 | A | * | 4/1996 | Nakayama | ................ B60L 3/00 307/18 |
| 9,966,206 | B1 | | 5/2018 | Sastry | |
| 2008/0084115 | A1 | | 4/2008 | King | |
| 2010/0314940 | A1 | | 12/2010 | Palmer | |
| 2015/0097571 | A1 | * | 4/2015 | Wei | ........................ G01R 31/52 324/531 |

(Continued)

FOREIGN PATENT DOCUMENTS

| EP | 1034442 A1 | 9/2000 |
| KR | 101659945 B1 * | 9/2016 |

(Continued)

OTHER PUBLICATIONS

ISRWO for PCT/GB2020/050489, dated Sep. 10, 2020, 20 pages.
(Continued)

*Primary Examiner* — Farhana A Hoque
*Assistant Examiner* — Dilara Sultana
(74) *Attorney, Agent, or Firm* — Maine Cernota & Curran

(57) ABSTRACT

Disclosed is an apparatus for testing a device, comprising: a switch (100) arranged to replace a circuit breaker (30) associated with an individual system in the device under test, wherein the switch (100) is operable to be controlled remotely from the device under test such that the switch (100) either activates or deactivates the individual system.

13 Claims, 3 Drawing Sheets

(56) References Cited

U.S. PATENT DOCUMENTS

2016/0178682 A1* 6/2016 Eldridge ............... H02H 11/00
                                                324/538
2019/0241284 A1* 8/2019 Benward ............... G01R 27/04

FOREIGN PATENT DOCUMENTS

WO         9927383 A1    6/1999
WO      WO-9927383 A1 *  6/1999   ........... G01S 7/4052
WO      2015149133 A1   10/2015

OTHER PUBLICATIONS

Extended European Search Report for Patent Appl No. 19275027.1-1022 dated Sep. 13, 2019, 9 Pages.
GB Search Report for Patent Appl. No. GB1902990.9 dated Jul. 8, 2019, 3 Pages.
WO Search Report for PCT/GB2020/050489 dated May 18, 2020, 15 Pages.
International Preliminary Report on Patentability & Written Opinion for Patent Appl. No. PCT/GB2020/050489 dated Sep. 16, 2021, 10 Pages.

* cited by examiner

RELATING TO TESTING

RELATED APPLICATIONS

This application is a national phase application filed under 35 USC § 371 of PCT Application No. PCT/GB2020/050489 with an International filing date of Feb. 8, 2020, which claims priority of GB Patent Application 1902990.9 filed Mar. 6, 2019, and of EP Patent Application 19275027.1, also filed on Mar. 6, 2019. All of these applications are incorporated herein by reference in their entirety for all purposes.

FIELD OF THE INVENTION

The present invention relates to remote control of certain features of a vehicle or platform in order to test the operation of the vehicle or platform in certain situations.

BACKGROUND OF THE INVENTION

In particular, embodiments of the present invention relate to the testing of certain operational features of an aircraft in a situation where it is not safe and/or practicable to operate such features by a human operator located in, or in the immediate vicinity of, the aircraft.

For instance, a problem may be experienced if an aircraft is to be Electromagnetic Compatibility (EMC) tested in a suitable anechoic chamber. Such testing may involve suspending or supporting the aircraft off the ground at a height of a few metres. Given the height and the presence of high power RF radiation, it is generally not safe for a human operator to be present within the chamber. However, a number of the tests which are performed require the manual activation/deactivation of certain aircraft systems. It is not typically possible to perform such operations remotely from the aircraft, which can hinder and/or delay the testing operations.

Throughout this application, the terms platform and vehicle are used interchangeably. In military terms, platform refers to an apparatus from which weapons may be deployed. It often, though not always, refers to a vehicle, such as an aircraft, but this is not the exclusive meaning.

SUMMARY OF THE INVENTION

It is an aim of embodiments of the present invention to address shortcomings in the prior art, whether mentioned herein or not.

According to the present invention there is provided an apparatus and method as set forth in the appended claims. Other features of the invention will be apparent from the dependent claims, and the description which follows.

According to a first aspect of the present invention, there is provided an apparatus for testing a device, comprising: a switch arranged to replace a circuit breaker associated with an individual system in the device under test, wherein the switch is configured to be controlled remotely from the device under test such that the switch either activates or deactivates the individual system.

In an embodiment the apparatus comprises a test chamber for containing the device.

In an embodiment, the apparatus comprises a controller configured to generate a control signal to operate the switch.

In an embodiment, the apparatus further comprises a suitable programmed computer and the controller is connectable to and further controllable the computer.

In an embodiment, the computer is connectable to the controller by a wired data connection.

In an embodiment, the computer is connectable to the controller by a wireless data connection.

In an embodiment, the computer is external to the test chamber.

In an embodiment, there is further provided a local power source.

In an embodiment, the apparatus comprises a plurality of switches, each being operable to activate or deactivate a particular individual system.

According to a second aspect of the present invention, there is provided a method of testing a device under test comprising the steps of: disconnecting a circuit breaker operable to provide power to a particular system; providing a remotely operable switch to provide power to the particular system; operating the remotely operable switch to provide power to, or remove power from, the particular system as required; and performing a test.

In an embodiment the method comprises providing a test chamber for containing the test under device, the remotely operable switch being operable from outside the test chamber.

In an embodiment the test chamber is an RF anechoic chamber.

In an embodiment the device is suspended off the ground of the test chamber.

In an embodiment, the method is carried out in an RF test environment such that performing a test comprises illuminating the device with high power RF radiation.

In an embodiment the device is a vehicle.

BRIEF DESCRIPTION OF THE DRAWINGS

For a better understanding of the invention, and to show how embodiments of the same may be carried into effect, reference will now be made, by way of example, to the accompanying diagrammatic drawings in which.

DETAILED DESCRIPTION

As mentioned previously, when testing an aircraft in an anechoic EMC test facility, it is not desirable to have a human operator in place, for health and safety reason associated with working at height and possible exposure to high power RF signals.

Such high power RF signals may be operable to provide a field strength of: up to between 180-220 V/m or up to 200 V/m; or up to 400-500 V/m or up to 450 V/m; or up to 4500-5500 or up to 5000 V/m. Such field strengths may vary according to the frequency of the RF signals. 30 MHz-300 MHz signals could be operable to provide a field strength of up to 200 V/m. 500 MHz-1 GHz signals could be operable to provide a field strength of up to 450 V/m. 1 GHz-18 GHz signals could be operable to provide a field strength of up to 5000 V/m An embodiment of the present invention is operable to allow remote control of certain aircraft systems in order to ensure compliance with relevant operational standards.

An embodiment of the invention provides a test apparatus operable to interface with certain systems of the aircraft under test, such that the systems in question can be remotely activated and/or deactivated as required in order to perform the tests.

Certain tests cannot be performed while certain aircraft systems are operational and in the absence of any other way of disabling such systems, embodiments of the present invention allow such systems to be effectively powered down for the duration of the test.

Figure 1:
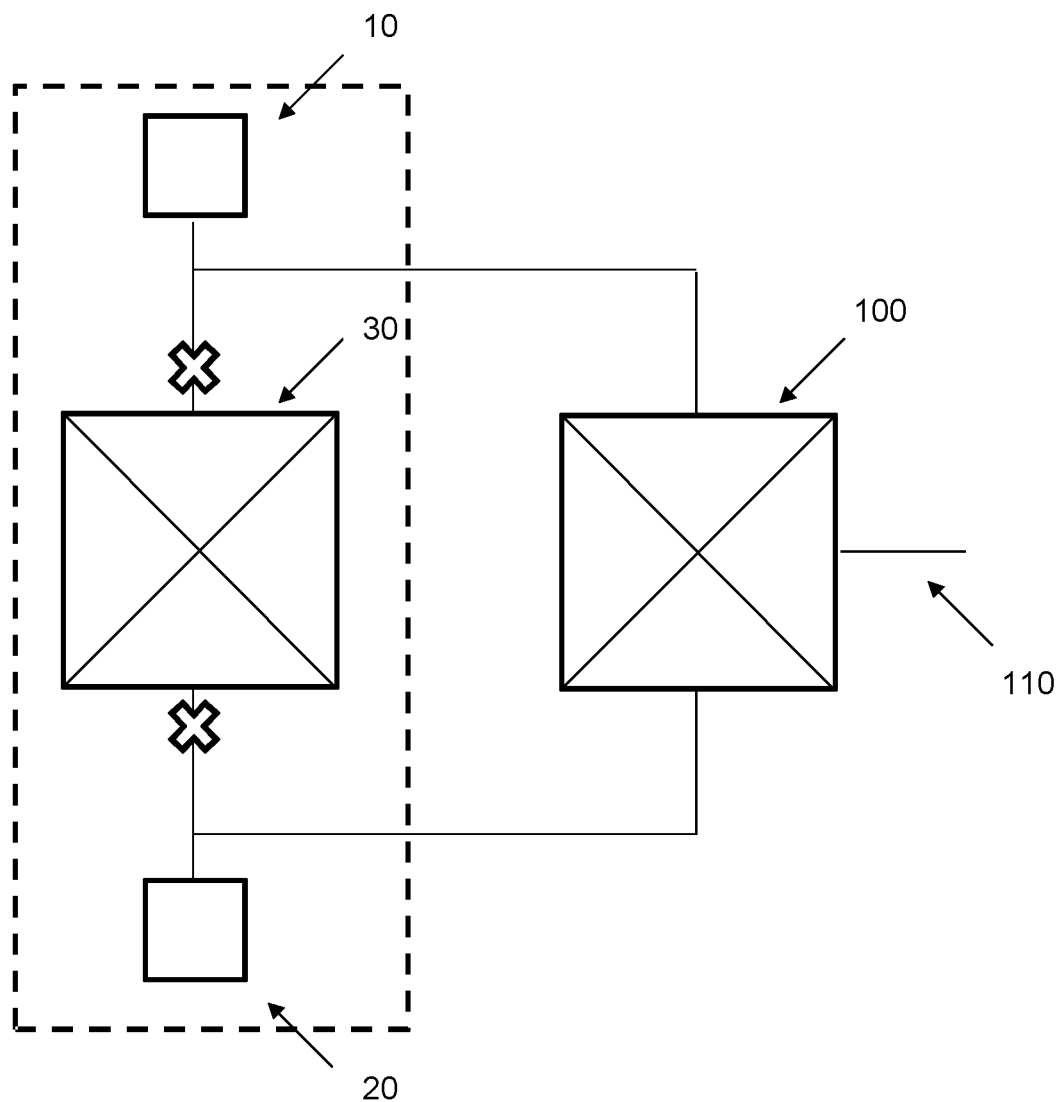
FIG. 1 shows a switch arrangement according to an embodiment of the present invention.

Power to individual aircraft systems is typically provided from an onboard power source with an in-line circuit breaker being provided per aircraft system. Access to the individual circuit breakers is not typically possible when the aircraft is under test for the reasons set out previously. In order to provide access to these circuit breakers, an embodiment of the invention provides a plurality of relays or switches which are temporarily wired in place of the aircraft circuit breakers to control power to individual respective systems or circuits. The plurality of relays or switches are arranged to be remotely switched FIG. 1 shows a schematic representation of a single circuit breaker and relay configuration according to an embodiment of the present invention. Here, the onboard systems of the aircraft are shown inside the dashed box. Power source 10 is connected via a circuit breaker 30 to an aircraft system 20. In order to bypass the onboard circuit breaker 30, it is disconnected from the circuit as indicated by the two crosses which show where the respective wires are cut or otherwise disconnected i.e. on either side of the circuit breaker 30.

In place of the circuit breaker 30, there is inserted into the circuit, switch 100, which is operable by a control signal applied via switch control port 110. The control signal, its operation and generation will be described in the following.

FIG. 1 shows a single instance of remotely operable switch 100. In a practical scenario, a plurality of such switches 100 may be provided, with each one of the switches being connected in-circuit in a similar manner and operable to activate/deactivate a particular aircraft system, as required by the test currently in progress.

In order to control the switch 100 or plurality of such switches, a test device comprising the switch 100 or plurality of switches 100 is provided. The test device 200 is illustrated in FIG. 2, along with a controlling computer 300 and device under test (e.g. aircraft) 400.

Often the test will be undertaken in a test chamber suitable to isolate the test environment from other working environments and/or personnel. This may be done for safety purposes or may be done to provide more reliable test results.

Figure 2:
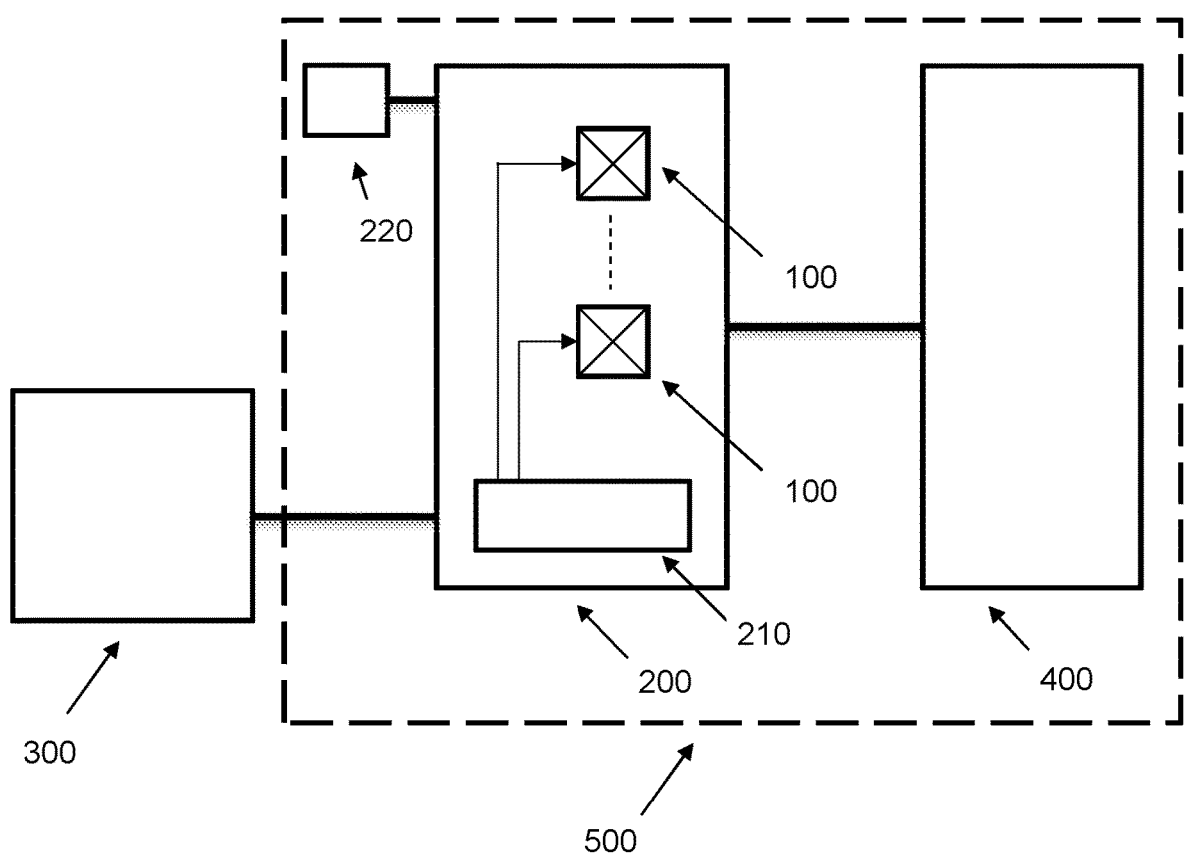
FIG. 2 shows a test device in a test environment, according to an embodiment of the present invention.

Accordingly, and as Illustrated in FIG. 2, there is provided a test chamber 500, specifically an EMC anechoic chamber. Test chamber 500 contains the switch 100 or plurality of switches 100, and contains the device under test 400. The computer 300 is external to the chamber 500.

The test device 200 comprises one or a plurality of switches 100, each of which is controlled by means of the control signal referred to previously, applied to the respective control port 110 of each switch 100.

The control signal is generated from a controller 210 which forms part of the test device 200. The controller 210, in turn, receives instructions from an associated computer 300 which is connected to the test device 200. The computer is connected in a wired manner using an ethernet or similar connection. In other embodiments, a wireless connection may be possible. Such a wireless connection is not typically suitable in the environment described so far, but there are other environments where such a connection would be possible and desirable.

The controller, in an embodiment, takes the form of a microcontroller or similar processor, connected to a plurality of General Purpose Input/Output (GPIO) ports, each of which may be used to drive a control signal to a respective switch 100, which in turn is able to activate or deactivate power to a system in the vehicle under test 400, as described previously. The microcontroller or processor is further provided with working and storage memory as required to support its operation.

In an embodiment, the controller 210 is a Raspberry Pi computer or similar device. Such a device is widely available, easy to program and suitable for use in an environment pertinent to embodiments of the present invention.

In practice, the computer 300 may be located at some distance from the vehicle under test 400, typically in a control room, which is shielded from the RF radiation present in the anechoic test chamber 500. The test device 200 is a small box comprising the controller and switches 100 and which is connected, as described to the various vehicle systems, so as to control power thereto.

The computer 300 is suitably programmed to send instructions to the test device 200 and the controller 210, in particular. The controller 210 is itself suitably programmed to interpret the instructions sent from the computer 300 and to selectively operate one or more of the switches 100 to activate or deactivate particular vehicle systems for the purposes of testing.

The controller 210 is suitably programmed using the Python programming language, which is suited to such use. The computer 300 utilises a Virtual Network Computer (VNC) connection to access and control the controller 210 and to provide visual feedback to a user.

The program running on the computer 300 is able to display a visual indication of the state of each of the switches 100 in the test device and so, by implication, the powered state of the respective vehicle system.

The computer 300 may run through an automated set of tests, whereby respective vehicle systems are activated and/or deactivated in a controlled sequence as the various tests are performed. Additionally, or alternatively, the computer 300 may be programmed to permit individual switches 100 to be operated as required.

The type of tests which are undertaken in connection with an aircraft may involve the aircraft response or performance in connection with incoming RADAR signals. As such, it is desirable that the test device 200 is unobtrusive in use.

Where the tests involve a response to incoming RADAR signals, a suitable RF signal generating device, such as an RF horn, can be provided at the chamber to illuminate the device. Tests may, additionally or alternatively, involve generating RF signals from components onboard the vehicle.

It may also be difficult to provide power to the test device, since there are strict controls on all electrical signals or connections which could interfere with the tests. As such, the controller 210 is powered by a separate battery device 220 internal to the test chamber 500. Portable battery booster packs, typically used with mobile telephones, which comprise a Li-ion power source are found to be suitable for this purpose. They are readily available and have a sufficient capacity to enable the controller 210 to run for several hours between recharges.

Figure 3:
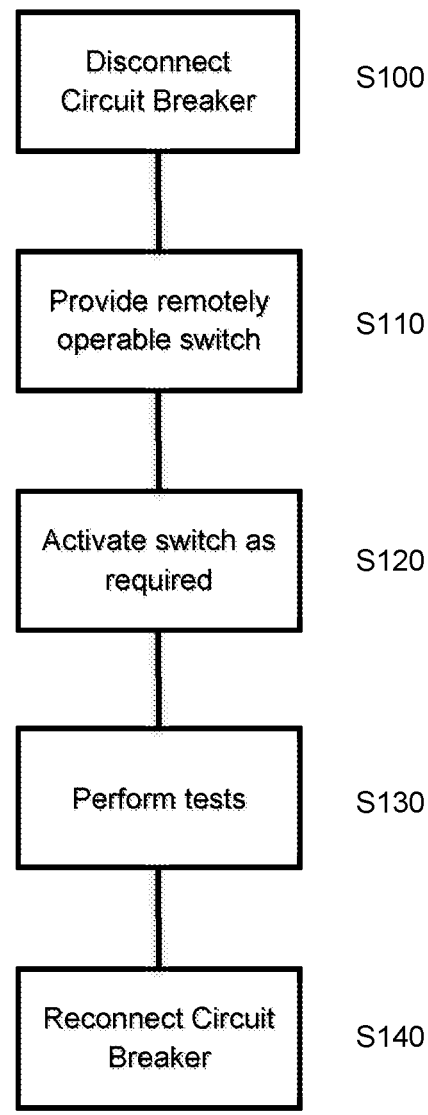
FIG. 3 shows a flowchart of a method according to an embodiment of the present invention.

An embodiment of the present invention further provides a testing method, as set out in the foregoing description. For the purposes of clarity, FIG. 3 shows a flowchart of the testing method.

At step S100, the onboard circuit breaker 30 is disconnected from the aircraft circuit. Such disconnection is temporary and only for the duration of the test procedure.

At step S110, remotely operable switch 100 is connected into the circuit to effectively replace the circuit breaker 30. The switch 100 is only provided for the duration of the test procedure.

At step S120, the switch 100 is operated as required by means of a control signal applied to control port 110. The control signal is provided from controller 201 under the control of computer 300. By operating switch 100, power can be selectively provided to or removed from the particular system under test.

At step S130, tests are performed with the particular system or systems deactivated as required. Note that steps S120 and S130 may be repeated with different systems activated/deactivated as required. The operation of the switches 100 and the performing of the tests may be automated under the control of computer 300, for instance, or may be undertaken in a manual manner.

After the tests have been completed and the device under test is no longer required to be tested, the circuit breaker or breakers 30, are reconnected and the device can operate in its normal manner.

As can be seen from the foregoing, embodiments of the present invention permit remote testing of a device where the physical presence of a user or operator is not possible for reasons of health, safety, access or other inhibiting factors.

Embodiments of the present invention may also find utility in the testing of, for instance: submarines, where physical space and/or access may be an issue; autonomous cars, where systems can be controlled by a wireless data connection, such as 4G; and weapons, where there may be an inherent explosion risk involved in the device to be tested.

At least some of the example embodiments described herein may be constructed, partially or wholly, using dedicated special-purpose hardware. Terms such as 'component', 'module' or 'unit' used herein may include, but are not limited to, a hardware device, such as circuitry in the form of discrete or integrated components, a Field Programmable Gate Array (FPGA) or Application Specific Integrated Circuit (ASIC), which performs certain tasks or provides the associated functionality. In some embodiments, the described elements may be configured to reside on a tangible, persistent, addressable storage medium and may be configured to execute on one or more processors. These functional elements may in some embodiments include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. Although the example embodiments have been described with reference to the components, modules and units discussed herein, such functional elements may be combined into fewer elements or separated into additional elements. Various combinations of optional features have been described herein, and it will be appreciated that described features may be combined in any suitable combination. In particular, the features of any one example embodiment may be combined with features of any other embodiment, as appropriate, except where such combinations are mutually exclusive. Throughout this specification, the term "comprising" or "comprises" means including the component(s) specified but not to the exclusion of the presence of others.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

What is claimed is:

1. An apparatus for testing a platform under test, the apparatus comprising: a test device comprising: a switch arranged to temporarily replace a circuit breaker configured to complete a power circuit of an individual system in the platform under test,
    wherein the switch is configured to be controlled remotely from the platform under test such that the switch either completes or interrupts the power circuit of the individual system; and
    a controller configured to generate a control signal to operate the switch; and a battery that is not a component of the system in the platform under test, the controller being powered by the battery, no element of the platform under test receiving power from the battery.

2. The apparatus according to claim 1 further comprising a test chamber for containing the platform under test.

3. The apparatus of claim 1 wherein the apparatus further comprises a suitably programmed computer and the controller is connectable to and further controllable by the computer.

4. The apparatus of claim 3 wherein the computer is connectable to the controller by a wired data connection.

5. The apparatus of claim 3 wherein the computer is connectable to the controller by a wireless data connection.

6. The apparatus of claim 3, wherein the computer is external to the test chamber.

7. The apparatus of claim 1, wherein the switch is included in a plurality of switches, each of the switches being operable to activate or deactivate a particular individual system.

8. A method of testing a platform under test, the method comprising: providing a test device comprising a remotely operable switch, a controller configured to generate a control signal to operate the remotely operable switch, and a battery that is not a component of the platform under test, the controller being powered by the battery;
    temporarily replacing a circuit breaker operable to provide power to complete a power circuit of a particular system in the platform with the remotely operable switch by disconnecting the circuit breaker from the particular system in the platform and connecting the switch to the particular system in the platform in place of the circuit breaker, so that the remotely operable switch is able to provide power to complete the power circuit of the particular system in the platform, and so that no element of the platform under test receives power from the battery;

operating the remotely operable switch to provide power to, or remove power from, the particular system in the platform as required;

performing a test; and disconnecting the switch from the particular system in the platform and reconnecting the circuit breaker to the particular system in the platform, thereby restoring the circuit breaker to being operable to provide power to the particular system in the platform, the switch, controller, and battery being thereby isolated from interacting with the platform under test.

9. The method of claim 8 wherein there is provided a test chamber for containing the platform under test, the remotely operable switch being operable from outside of the test chamber.

10. The method of claim 9 wherein the test chamber is an RF anechoic chamber.

11. The method of claim 9, wherein the platform under test is suspended off the ground of the test chamber.

12. The method of claim 8, wherein the method is carried out in an RF test environment such that performing the test comprises illuminating the platform under test with high power RF radiation.

13. The method of claim 8, wherein the platform under test is a vehicle.

* * * * *